(12) United States Patent
Hwang

(10) Patent No.: US 12,224,188 B2
(45) Date of Patent: Feb. 11, 2025

(54) COOLING SHEET ATTACHMENT APPARATUS TO FOCUSING RING FOR SEMICONDUCTOR MANUFACTURING APPARATUS

(71) Applicant: CM TECH Co., Ltd., Gyeonggi-do (KR)

(72) Inventor: Man Soo Hwang, Gyeonggi-do (KR)

(73) Assignee: CM TECH Co., Ltd., Gyeonggi-do (KR)

( * ) Notice: Subject to any disclaimer, the term of this patent is extended or adjusted under 35 U.S.C. 154(b) by 646 days.

(21) Appl. No.: 17/500,494

(22) Filed: Oct. 13, 2021

(65) Prior Publication Data
US 2022/0181175 A1    Jun. 9, 2022

(30) Foreign Application Priority Data

Dec. 4, 2020  (KR) .......................... 10-2020-0168292

(51) Int. Cl.
| H01L 21/683 | (2006.01) |
| H01L 21/67 | (2006.01) |
| H01L 21/687 | (2006.01) |

(52) U.S. Cl.
CPC .... H01L 21/67109 (2013.01); H01L 21/6838 (2013.01); H01L 21/68742 (2013.01)

(58) Field of Classification Search
CPC ........... H01L 21/67109; H01L 21/6838; H01L 21/68742; H01J 2237/332–3348
USPC .................................................. 156/345.12
See application file for complete search history.

(56) References Cited

U.S. PATENT DOCUMENTS

| 6,719,851 | B1 | 4/2004 | Kurita et al. |
| 2002/0040682 | A1* | 4/2002 | Ramsay ................ C23C 14/243 118/723 EB |
| 2006/0071384 | A1* | 4/2006 | Lee ..................... H01L 21/6719 269/287 |
| 2008/0067320 | A1* | 3/2008 | Takayama .............. B21D 24/04 249/177 |

(Continued)

FOREIGN PATENT DOCUMENTS

| JP | 2006-114598 | 4/2006 |
| JP | 2014-017380 | 1/2014 |

(Continued)

OTHER PUBLICATIONS

Office Action dated Jul. 21, 2023 corresponding to Chinese Application No. 202111202158.3, 9 pages.

*Primary Examiner* — Charlee J. C. Bennett

(57) ABSTRACT

Provided is a cooling sheet attachment apparatus to a focusing ring for a semiconductor manufacturing apparatus, including: a vacuum chamber equipped with a sheet support ring fixed to seat a cooling sheet in a chamber body with an adhesion surface exposed in an upward direction, a centering jig installed on an inner or outer circumferential surface of the sheet support ring liftably to be moved back in the upward direction by an elastic support, a cover for opening/closing installed above the chamber body and lifted by a lift unit, a press unit provided on the cover to press down the focusing ring, and a vacuum suction tube connected to the chamber body for vacuum suction; and a vacuum suction unit to create a vacuum in the vacuum chamber by the suction through the vacuum suction tube.

9 Claims, 8 Drawing Sheets

(56) References Cited

U.S. PATENT DOCUMENTS

2014/0008010 A1* 1/2014 Kitabata ............... B29C 66/472
 156/228
2014/0202631 A1* 7/2014 Kanbara ........... H01J 37/32642
 118/723 VE
2018/0090347 A1* 3/2018 Kitagawa ............... A46B 13/02

FOREIGN PATENT DOCUMENTS

| | | |
|---|---|---|
| JP | 2020-053538 | 4/2020 |
| KR | 10-2003-0026996 | 4/2003 |
| KR | 10-2004-0043458 | 5/2004 |
| KR | 10-2014-0095018 | 7/2014 |
| KR | 10-1744371 | 6/2017 |

* cited by examiner

COOLING SHEET ATTACHMENT APPARATUS TO FOCUSING RING FOR SEMICONDUCTOR MANUFACTURING APPARATUS

CROSS-REFERENCE TO RELATED APPLICATION

This application claims priority of Korean Patent Application No. 10-2020-0168292, filed on Dec. 4, 2020, in the KIPO (Korean Intellectual Property Office), the disclosure of which is incorporated herein entirely by reference.

BACKGROUND OF THE INVENTION

Field of the Invention

The present disclosure relates to a cooling sheet attachment apparatus to a focusing ring for a semiconductor manufacturing apparatus, and more particularly, to a cooling sheet attachment apparatus to a focusing ring for a semiconductor manufacturing apparatus, which attaches the cooling sheet to the focusing ring in an exact position and facilitates the cooling sheet attachment task, thereby minimizing the time and cost required for the cooling sheet attachment task and improving the attachment quality of the cooling sheet to the focusing ring, and is easily adapted to focusing rings having different sizes.

Description of the Related Art

In general, semiconductor devices are manufactured by performing a variety of unit processes such as a photolithography process, a diffusion process, an etching process, a chemical vapor deposition process and chemical mechanical planarization (CMP).

In manufacturing the semiconductor devices, when a difference in height on semiconductor wafer surface occurs in a microcircuit stacking process, the difference causes a critical defect to the quality of the semiconductor devices, and a process for solving this problem is a CMP process. The CMP process is usually performed after thin film deposition, and a thin film is formed on a wafer, followed by planarization, and etching and deposition is performed to form a circuit again thereon.

The CMP process involves placing and rotating the wafer on a polishing machine including a rotary table, a compressor and a slurry spray. Additionally, in the CMP process, a focusing ring is installed around the wafer, and the focusing ring reduces thermal damage applied to the wafer through dissipation of heat generated during polishing of the wafer.

To increase the cooling effect, a cooling sheet is attached to one surface of the focusing ring used in the CMP process, and it is necessary to periodically replace the cooling sheet.

The attachment of the cooling sheet to the focusing ring has been manually performed by operators, and it is difficult to accurately attach the cooling sheet to the focusing ring in a predefined position, and as a consequence, the attachment quality of the cooling sheet differs depending on operators' skills, and when bubbles are formed between the focusing ring and the cooling sheet, the bubbles cause defects in the focusing ring, and moreover, cost and time is wasted in re-attaching the cooling sheet.

SUMMARY OF THE INVENTION

To solve the above-described problem of the related art, the present disclosure is aimed at attaching a cooling sheet to a focusing ring in an exact position and facilitating the cooling sheet attachment task, thereby minimizing the time and cost required for the cooling sheet attachment task and eliminating the need for an operator's skill, and improving the attachment quality of the cooling sheet to the focusing ring, thereby increasing the cooling efficiency of the focusing ring, which contributes to semiconductor yield improvements, and preventing bubble formation between the focusing ring and the cooling sheet, thereby minimizing defects in the focusing ring caused by the cooling sheet, and being easily adapted to focusing rings having different sizes.

Other objects of the present disclosure will be easily understood through the following description of embodiments.

To achieve the above-described object, according to an aspect of the present disclosure, there is provided a cooling sheet attachment apparatus to a focusing ring for a semiconductor manufacturing apparatus including: a vacuum chamber equipped with a sheet support ring fixed to seat a cooling sheet in a chamber body with an adhesion surface exposed in an upward direction, a centering jig installed on an inner or outer circumferential surface of the sheet support ring liftably to be moved back in the upward direction by an elastic support, so that the focusing ring is aligned above the cooling sheet in a state of being supported by the centering jig, a cover for opening/closing installed above the chamber body and lifted by a lift unit, a press unit provided on the cover to press down the focusing ring so that the cooling sheet is attached to a lower surface of the focusing ring by pressing into tight contact, and a vacuum suction tube connected to the chamber body for vacuum suction; and a vacuum suction unit to create a vacuum in the vacuum chamber by the suction through the vacuum suction tube.

The sheet support ring may have alignment pins protruding on an upper surface, each of the alignment pins corresponding to each of a plurality of alignment grooves formed at an interval in a circumferential direction on the lower surface of the focusing ring and inserted into each alignment groove, and may be supported and fixed by a plurality of fixtures provided vertically on a lower surface of the chamber body, and the elastic support may be integrally formed with the fixtures.

The centering jig may be installed concentrically in contact with the inner circumferential surface of the sheet support ring and lifted up and down in a state of being elastically supported by the elastic support, and may include a support along an outer circumferential surface in the shape of a step so that the focusing ring is concentrically mounted downward and held and supported in the support, a plurality of alignment grooves formed at an interval along a circumferential direction on a lower surface, each alignment groove in which lifting pins of the elastic support are each mounted, to mount in alignment on the elastic support, and a center reinforcement split into a plurality of branches from a center and connected.

The elastic support may include a support block integrally formed with each of the fixtures which fix the sheet support ring and provided at a distance in the upward direction apart from a bottom of the chamber body, the support block including a sliding coupler vertically formed and having an open top, and an upper stopper and a lower stopper spaced in a vertical direction apart from each other in the sliding coupler, a lifting pin slidably coupled to the sliding coupler, with a top mounted in the alignment grooves formed on the lower surface of the centering jig, and having a stop protrusion provided on an outer side and held in the upper stopper, and an elastic member which is inserted into the lifting pin and installed between the stop protrusion and the lower stopper to provide an elastic force to the lifting pin in the upward direction.

The cover may be installed to be rotated by a rotating shaft from a rotary coupling member, and when the cover closes the chamber body, the chamber body is not opened by the vacuum created between the cover and the chamber body, the lift unit may include a lift guide installed between the rotary coupling member and the body to guide the lifting of the rotary coupling member, and a lift driving unit installed between the rotary coupling member and the body to lift the rotary coupling member together with the cover, and an opposite side of the rotary coupling member may be supported by a closed stopper which is lifted by a balance driving unit when the cover is lifted by the lift unit.

The press unit may include a plurality of sliding shafts passing through and installed slidably in the cover, a pressing plate fixed to an end of each sliding shaft, and inserted into the chamber body when the cover closes the chamber body, a connecting plate fixed to an opposite end of each sliding shaft, and disposed opposite the pressing plate with the cover interposed between, a press driving unit installed between the connecting plate and the cover to move the connecting plate to allow the pressing plate to press the focusing ring on the centering jig or release the pressing, a pressing piece fixed to the press driving unit to transmit an up-down reciprocating driving force of the press driving unit to the connecting plate, and a load cell interposed between the pressing piece and the connecting plate to measure a downward pressing force applied to the connecting plate by the press driving unit and output a sensing signal.

According to the cooling sheet attachment apparatus to a focusing ring for a semiconductor manufacturing apparatus according to the present disclosure, it is possible to attach the cooling sheet to the focusing ring in an exact position and facilitate the cooling sheet attachment task, thereby minimizing the time and cost required for the cooling sheet attachment task and eliminating the need for an operator's skill, and improve the attachment quality of the cooling sheet to the focusing ring, thereby increasing the cooling efficiency of the focusing ring, which contributes to semiconductor yield improvements, and prevent bubble formation between the focusing ring and the cooling sheet, thereby minimizing defects in the focusing ring caused by the cooling sheet, and it is easily adapted to focusing rings having different sizes only by changing the centering jig.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
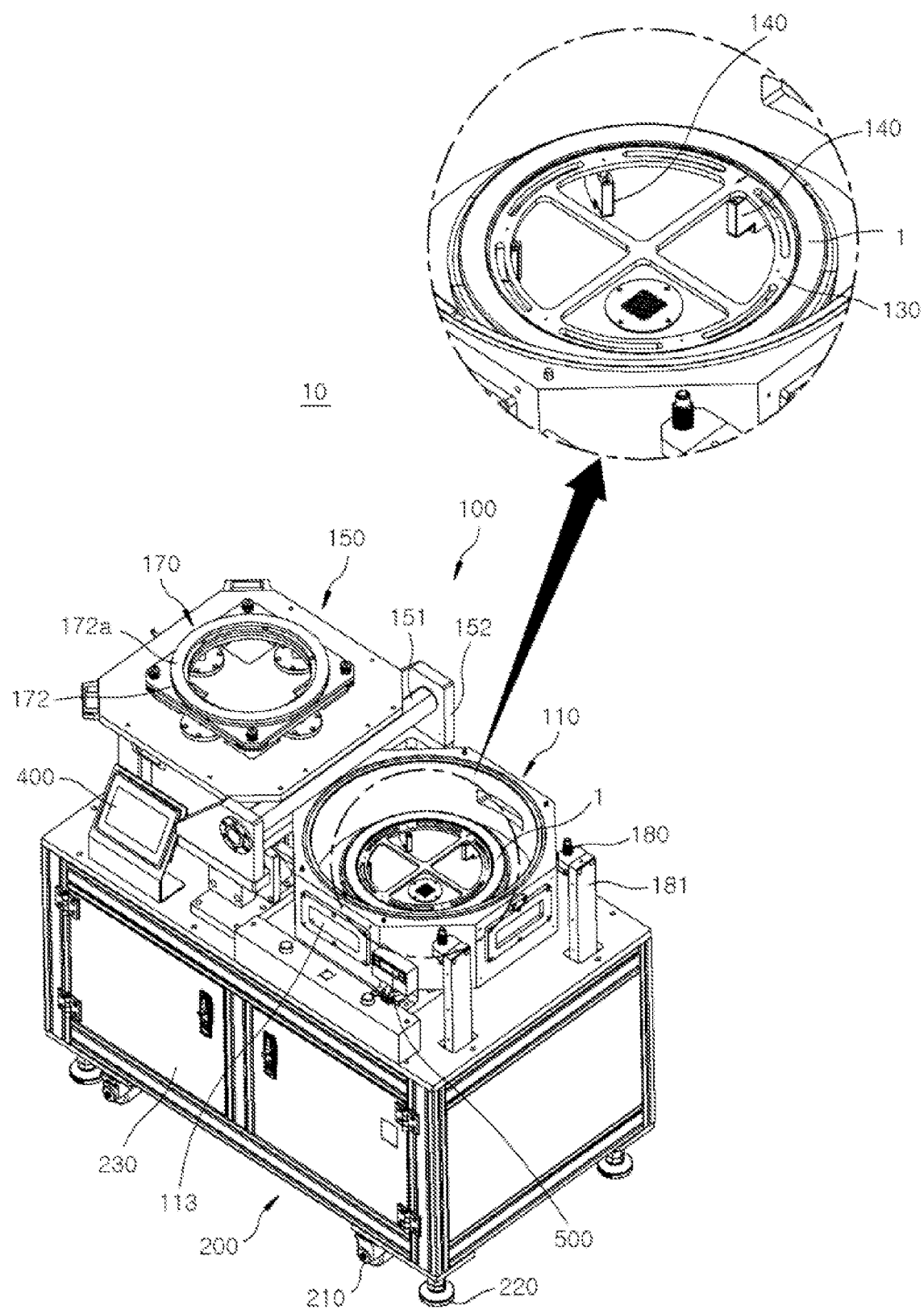
FIG. 1 is a perspective view showing a cooling sheet attachment apparatus to a focusing ring for a semiconductor manufacturing apparatus according to an embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 2:
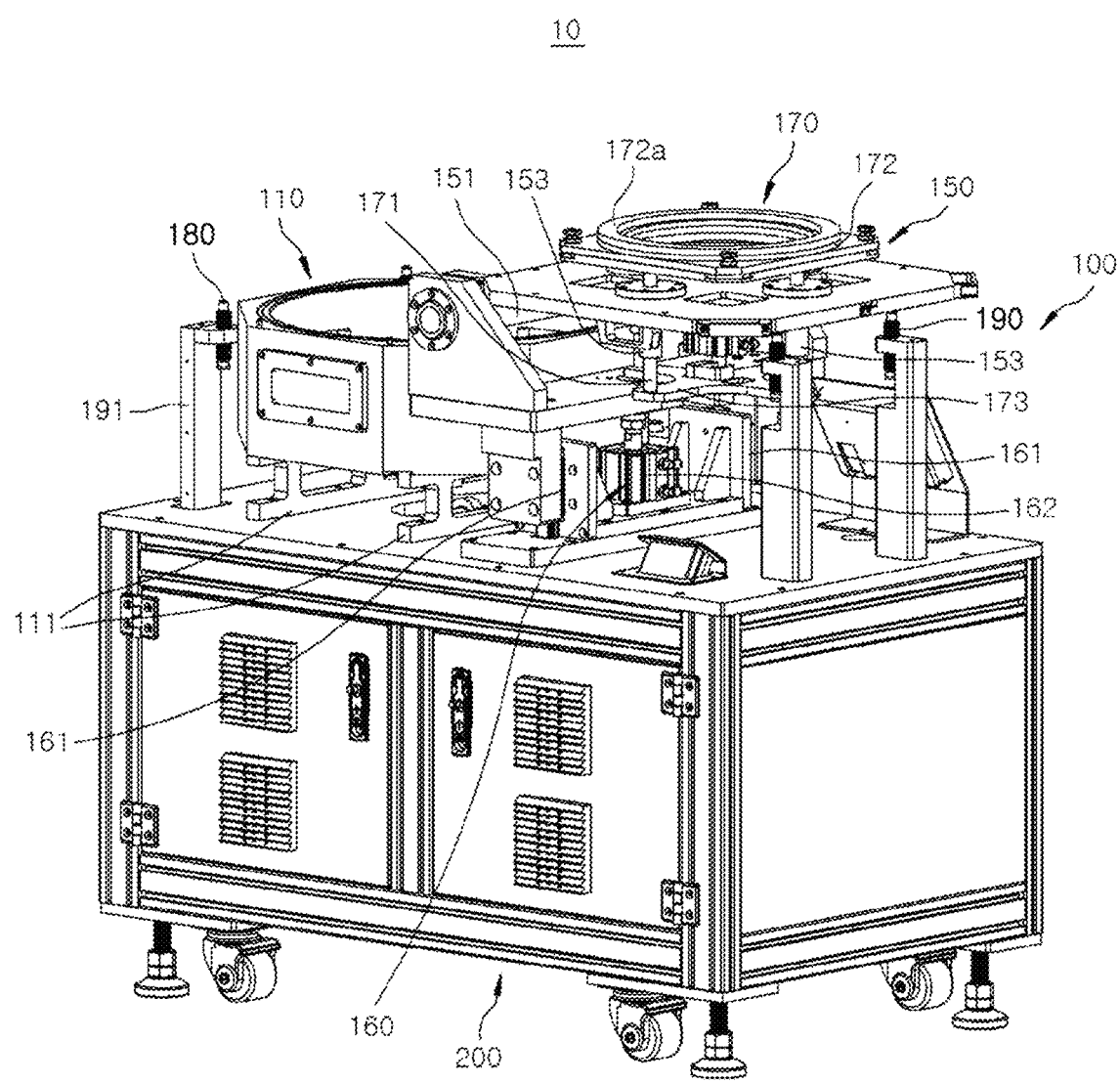
FIG. 2 is a rear perspective view showing a cooling sheet attachment apparatus to a focusing ring for a semiconductor manufacturing apparatus according to an embodiment of the present disclosure.
Figure 3:
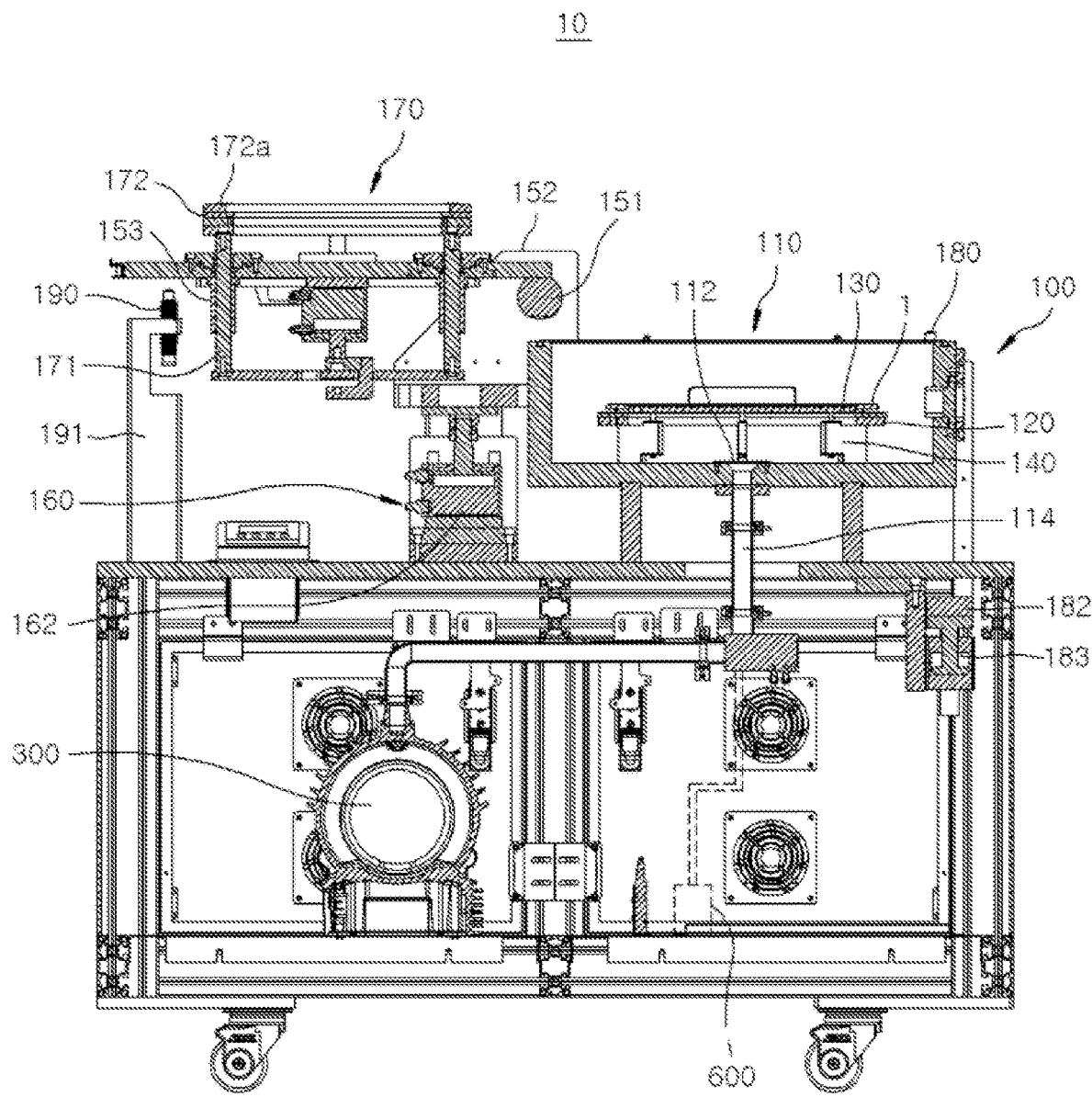
FIG. 3 is a front cross-sectional view showing a cooling sheet attachment apparatus to a focusing ring for a semiconductor manufacturing apparatus according to an embodiment of the present disclosure.

FIG. 1 is a perspective view showing a cooling sheet attachment apparatus to a focusing ring for a semiconductor manufacturing apparatus according to an embodiment of the present disclosure, FIG. 2 is a rear perspective view showing the cooling sheet attachment apparatus to a focusing ring for a semiconductor manufacturing apparatus according to an embodiment of the present disclosure, and FIG. 3 is a front cross-sectional view showing the cooling sheet attachment apparatus to a focusing ring for a semiconductor manufacturing apparatus according to an embodiment of the present disclosure.

Referring to FIGS. 1 to 3, the cooling sheet attachment apparatus 10 to a focusing ring for a semiconductor manufacturing apparatus according to an embodiment of the present disclosure is used to attach a cooling sheet 2 (shown in FIG. 4) to the focusing ring 1 for a semiconductor manufacturing apparatus, and may include a vacuum chamber 100 and a vacuum suction unit 300. Here, the focusing ring 1 is used in, for example, a Chemical Mechanical Planarization (CMP) apparatus, the cooling sheet 2 (shown in FIG. 4) may be attached to one surface of the focusing ring 1 to increase the cooling effect, and the focusing ring 1 may include any ring member that is mounted in an apparatus for semiconductor manufacturing and needs a cooling sheet to be attached.

In an example, the vacuum chamber 100 may be independently installed, or as another example, the vacuum chamber 100 may be installed in a body 200 as presented in this embodiment. The body 200 may provide a workspace for installing the vacuum chamber 100 on the upper surface, and may include a door 230 to open/close an internal storage space of either the front surface or the rear surface or both. The body 200 may include a plurality of casters 210 for movement on the lower surface, and a base 220 screw-coupled to secure to the ground by adjusting the distance from the ground. The base 220 may be screw-coupled to the lower surface of the body 200 to adjust the inclination of the body 200 by rotational manipulation.

In the vacuum chamber 100, the focusing ring 1 is elastically supported and installed above the cooling sheet 2 (shown in FIG. 9) seated in a chamber body 110 installed in the body 200, a cover 150 is provided to close the chamber body 110, a vacuum suction tube 114 is connected to create a vacuum inside, and the focusing ring 1 is pressed into tight contact with the cooling sheet 2.

Referring to FIGS. 1 to 5, in an example, the vacuum chamber 100 may be equipped with a sheet support ring 120 fixed to seat the cooling sheet 2 in the chamber body 110 with an adhesion surface exposed in the upward direction, a centering jig 130 installed on the inner or outer circumferential surface of the sheet support ring 120 liftably to be moved back in the upward direction by an elastic support 140, so that the focusing ring 1 may be aligned above the cooling sheet 2 in a state of being supported by the centering jig 130, the cover 150 for opening/closing installed above the chamber body 110 and lifted by a lift unit 160, a press unit 170 provided on the cover 150 to press down the focusing ring 1 so that the cooling sheet 2 may be attached to the lower surface of the focusing ring 1 by pressing into tight contact, and the vacuum suction tube 114 connected to the chamber body 110 for vacuum suction.

The chamber body 110 is installed on the body 200, and has an open top. The chamber body 110 may be installed above the body 200 by a plurality of spacers 111 provided on the lower surface, and may have a window 113 of a light permeable material air-tightly formed on either the front surface or the rear surface or both to observe the inside. For vacuum suction, the chamber body 110 may have an inlet 112 on the side to which the vacuum suction tube 114 is connected. To prevent an object from escaping through the inlet 112, a mesh or a porous plate may be installed in the inlet 112, or the inlet 112 may be formed with a porous structure. Here, the vacuum suction tube 114 may be connected from the vacuum suction unit 300 to the chamber body 110 for vacuum suction, and for example, may be connected to the inlet 112 and extend downward from the lower surface of the chamber body 110.

The sheet support ring 120 may seat the cooling sheet 2 in the chamber body 110 with the adhesion surface exposed in the upward direction, and may have a plurality of sheet seating areas for seating of the cooling sheet 2 on the upper surface. The cooling sheet 2 may be seated for each sheet seating area and have an adhesive layer for adhesion with the focusing ring 1 on one surface, and may be made of a film material that is advantageous for cooling, and divided into a plurality of parts, for example, 8 to 10 parts, for each focusing ring 1.

Figure 7:
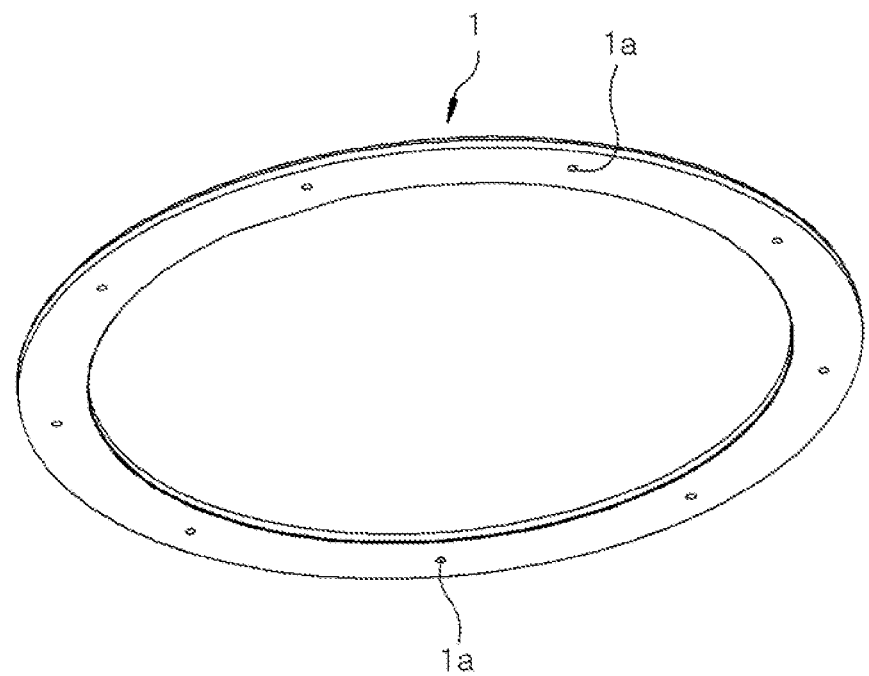
FIG. 7 is a bottom perspective view showing a focusing ring in a cooling sheet attachment apparatus to a focusing ring for a semiconductor manufacturing apparatus according to an embodiment of the present disclosure.

The sheet support ring 120 may have alignment pins 121 protruding on the upper surface, each alignment pin 121 corresponding to each of a plurality of alignment grooves 1a (see FIG. 7) formed at an interval in the circumferential direction on the lower surface of the focusing ring 1 so that each alignment pin 121 is inserted into each alignment groove 1a, and may be supported and fixed by a plurality of fixtures 122 vertically provided on the lower surface of the chamber body 110, and the elastic support 140 may be integrally formed with the fixtures 122. The sheet support ring 120 may be installed at a distance apart in the upward direction from the bottom in the chamber body 110 by the fixtures 122.

Referring to FIGS. 1 to 6, the centering jig 130 may be installed concentrically in contact with the inner circumferential surface of the sheet support ring 120 and lifted up and down in a state of being elastically supported by the elastic support 140, and may include a support 132 along the outer circumferential surface in the shape of a step so that the focusing ring 1 may be concentrically mounted down and held and supported in the support 132, a plurality of alignment grooves 131 formed at an interval along the circumferential direction on the lower surface, each alignment groove 131 in which lifting pins 142 of the elastic support 140 are each mounted, to mount in alignment on the elastic support 140, and a center reinforcement 133 split into a plurality of branches from the center and connected. Here, for example, the center reinforcement 133 may have a "+"

shape, but is not necessarily limited thereto, and it is obvious that the center reinforcement 133 may have various numbers of branches, other than four branches, from the center. Accordingly, the center reinforcement 133 can prevent twists when an external force such as downward pressing of the focusing ring 1 is applied to the centering jig 130. Additionally, since the centering jig 130 is reinforced by the center reinforcement 133, the centering jig 130 may maintain desired strength despite reducing its weight by formation of a plurality of openings 134.

As presented in this embodiment, the elastic support 140 may be integrally formed with each of the fixtures 122 and provided at a distance apart in the upward direction from the bottom of the chamber body 110, and may include a support block 141 including a sliding coupler 141a vertically formed and having an open top, and an upper stopper 141b and a lower stopper 141c spaced in the vertical direction apart from each other in the sliding coupler 141a, a lifting pin 142 slidably coupled to the sliding coupler 141a, with the top mounted in the alignment grooves 131 formed on the lower surface of the centering jig 130, and having a stop protrusion 142a provided on the outer side and held in the upper stopper 141b, and an elastic member 143, such as a compression coil spring, inserted into the lifting pin 142 and installed between the stop protrusion 142a and the lower stopper 141c to provide an elastic force to the lifting pin 142 in the upward direction.

The cover 150 may open/close the top of the chamber body 110 by rotation, and as presented in this embodiment, may be installed and disposed on one side of the chamber body 110 above the body 200. The cover 150 may be installed to be rotated by a rotating shaft 151 from a rotary coupling member 152, and when the cover 150 closes the chamber body 110, the chamber body 110 is not opened by a vacuum created between the cover 150 and the chamber body 110. That is, although the cover 150 is simply seated on the chamber body 110, the cover 150 does not open the chamber body 110 by a negative pressure formed between the cover 150 and the chamber body 110 despite the pressing operation of the press unit 170 as described below.

The lift unit 160 may lift the cover 150 to provide a path for the cover 150 to easily move up to the chamber body 110 from the body 200. The lift unit 160 may include a lifting guide 161 installed between the rotary coupling member 152 and the body 200 to guide the lifting of the rotary coupling member 152 and a lift driving unit 162 installed between the rotary coupling member 152 and the body 200 to lift the rotary coupling member 152 together with the cover 150. Here, the lifting guide 161 may include a linear motion guide (LM guide) as presented in this embodiment and is not limited thereto, and may include a variety of linear motion guide devices including a guide axis and a ball bearing coupling structure connected to the guide axis. As presented in this embodiment, the lift driving unit 162 may include a cylinder that works by the pressure of a fluid, and a body and a piston rod may be fixed to any one of the rotary coupling member 152 and the body 200 and the other, respectively, and besides, a driving means which converts a rotational force of a rotary motor into a linear motion or a linear motor which provides a linear motion may be used.

Meanwhile, when the cover 150 is lifted by the lift unit 160, the opposite side of the rotary coupling member 152 may be supported by a closed stopper 180 which is lifted by a balance driving unit 183. The closed stopper 180 may be installed to protrude upward by a first vertical frame 181 to support the cover 150 closing the top of the chamber body 110 above the body 200, and each of the plurality of first vertical frames 181 may be connected to each other with a horizontal frame 182, so that the horizontal frame 182 may be lifted together with the first vertical frame 181 and the closed stopper 180 by the balance driving unit 183. The balance driving unit 183 may include a driving device which converts a rotational force of a cylinder, a linear motor or a rotary motor into linear reciprocation. Additionally, an open stopper 190 may be provided to support the cover 150 having opened the top of the chamber body 110 above the body 200. The open stopper 190 may be installed on top of a second vertical frame 191 vertically installed on the body 200 to support the cover 150 at an optimum height.

The press unit 170 is installed on the cover 150 to press down the focusing ring 1 on the centering jig 130, so that the cooling sheet 2 is attached to the lower surface of the focusing ring 1 by the pressing into tight contact. The press unit 170 may include, for example, as presented in this embodiment, a plurality of sliding shafts 171 passing through and slidably installed in the cover 150, a pressing plate 172 fixed to one end of each sliding shaft 171 and inserted into the chamber body 110 when the cover 150 closes the chamber body 110, a connecting plate 173 fixed to the opposite end of each sliding shaft 171 and disposed opposite the pressing plate 172 with the cover 150 interposed between, a press driving unit 174 installed between the connecting plate 173 and the cover 150 to move the connecting plate 173 to allow the pressing plate 172 to press down the focusing ring 1 on the centering jig 130 or release the pressing, a pressing piece 176 fixed to the press driving unit 174 to transmit an up-down reciprocating driving force of the press driving unit 174 to the connecting plate 173, and a load cell 175 interposed between the pressing piece 176 and the connecting plate 173 to measure a downward pressing force applied to the connecting plate 173 by the press driving unit 174 and output as a sensing signal.

For smooth sliding in the cover 150, the sliding shaft 171 may be connected to the open side of the cover 150 and slidably coupled to a sliding guide 153 having a bearing embedded therein. To prevent scratch or damage of the focusing ring 1 on the pressing side of the focusing ring 1, the pressing plate 172 may include a buffer pad 172a made of a cushioning material such as silicone or rubber, installed on the outer surface of the focusing ring 1. The connecting plate 173 is bolted to the end of each sliding shaft 171 to simultaneously move all the sliding shafts 171. As presented in this embodiment, the press driving unit 174 may include a cylinder that works with the pressure of a fluid, and a body and a piston rod may be fixed to any one of the connecting plate 173 and the cover 150 and the other, respectively, and besides, a driving means that converts a rotational force of a rotary motor into a linear motion or a linear motor that provides a linear motion may be used. As presented in this embodiment, the pressing piece 176 may be formed in a "☐" shape, and connected to the press driving unit 174 and installed in the connecting plate 173 vertically slidably in the limited range. In this instance, as presented in this embodiment, the load cell 175 may be installed between the top of the connecting plate 173 and the inner surface of the pressing piece 176 to transmit and apply the force applied from the pressing piece 176 down to the connecting plate 173. Meanwhile, the pressing force by the press driving unit 174 may be displayed through a display unit 500 as described below as a measurement value of the load cell 175. Additionally, the load cell 175 may be used to measure the pressing force of the press driving unit 174 in real time, so that the pressing force of the press driving unit 174 may be controlled to a pressing force set by a manipulation unit 400 as described below, for example, by a control unit.

The vacuum suction unit 300 may create a vacuum in the vacuum chamber 100 by suction, and for example, a variety of vacuum supply devices including a suction pump may be used. As presented in this embodiment, the vacuum suction unit 300 may be installed in the storage space which is opened/closed by the door 230 in the body 200. Additionally, to devacuum the vacuum chamber 100, a devacuuming unit 600 such as an air injection pump for injecting air into the vacuum chamber 100 or an open/close valve for injecting the outdoor air may be added to a vacuum feed path, or may be formed as an independent path that is separate from the vacuum feed path.

Meanwhile, to control the operation of the lift unit 160, the press unit 170 and the vacuum suction unit 300, the cooling sheet attachment apparatus 10 to a focusing ring for a semiconductor manufacturing apparatus according to an embodiment of the present disclosure may include, on the body 200, the manipulation unit 400 for input of a command as a signal, and the display unit 500 to display the vacuum pressure of the vacuum chamber 100 or other necessary operating conditions. Additionally, the cooling sheet attachment apparatus 10 to a focusing ring for a semiconductor manufacturing apparatus according to the present disclosure may be configured to manually perform each step set by the manipulation of the manipulation unit 400, or perform the operations in a sequential order according to a process set by the control unit.

The operation of the cooling sheet attachment apparatus to a focusing ring for a semiconductor manufacturing apparatus according to the present disclosure will be described.

Figure 4:
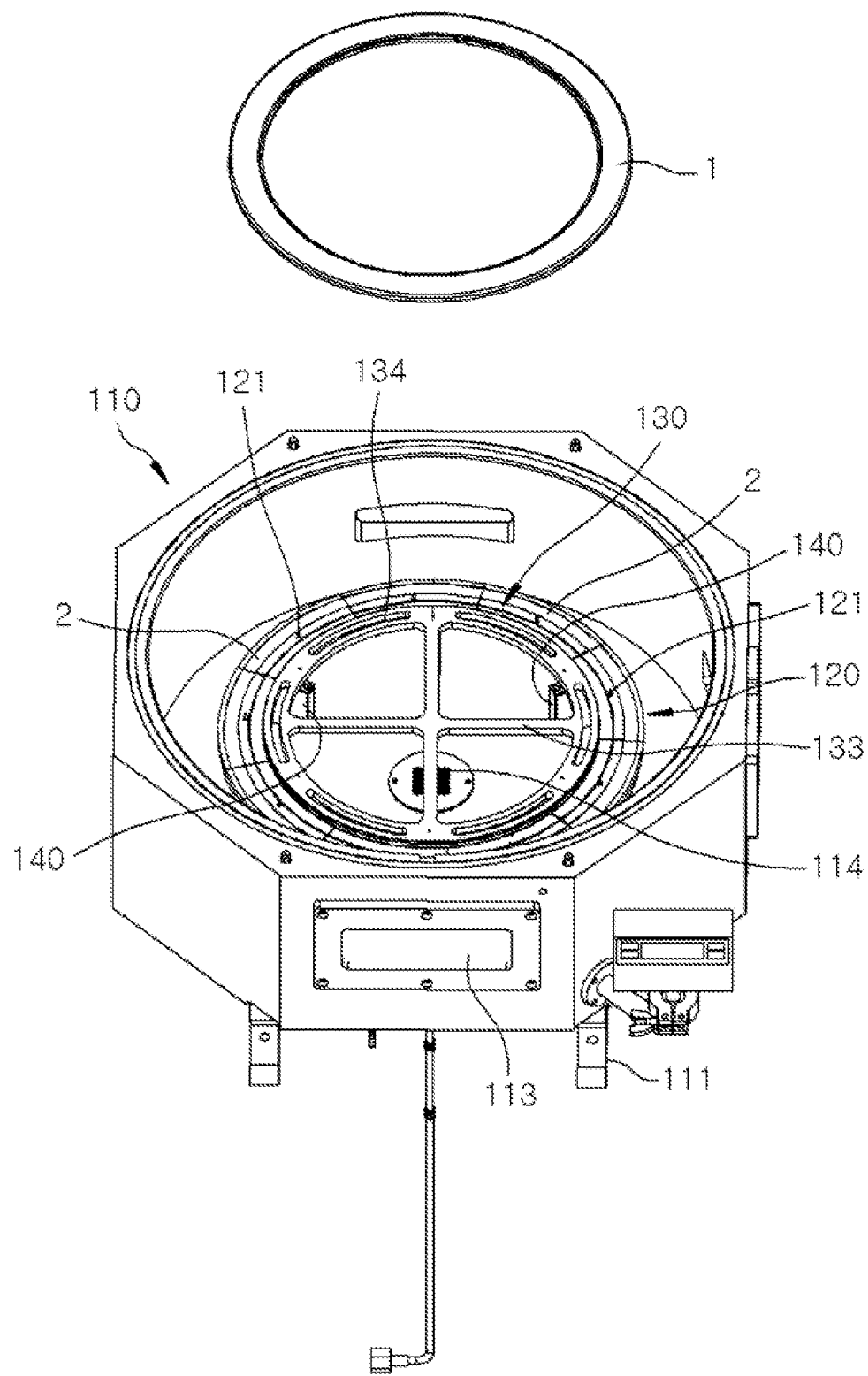
FIG. 4 is a perspective view showing a chamber of a cooling sheet attachment apparatus to a focusing ring for a semiconductor manufacturing apparatus according to an embodiment of the present disclosure, showing the separated focusing ring.
Figure 5:
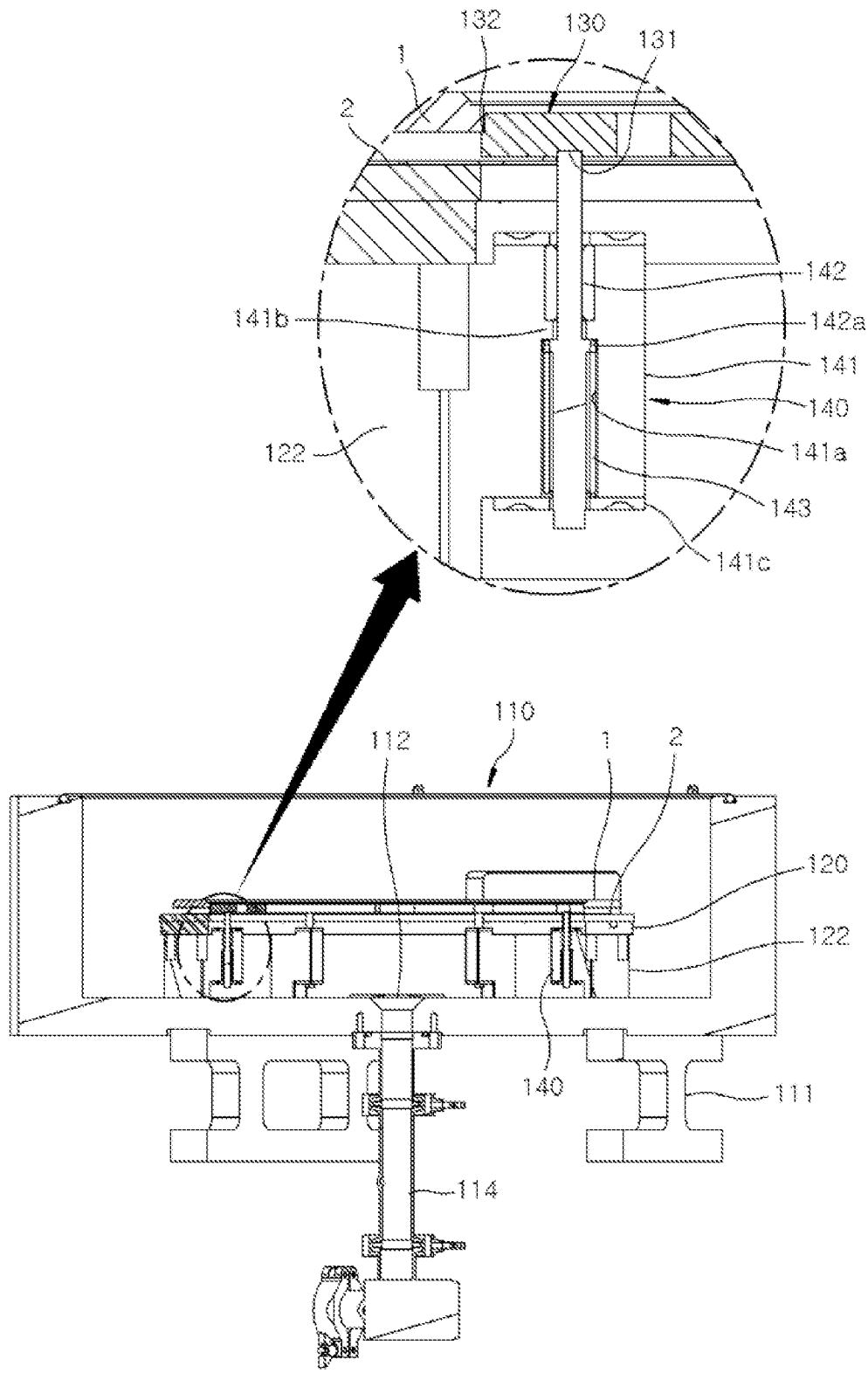
FIG. 5 is a front cross-sectional view showing a chamber body of a cooling sheet attachment apparatus to a focusing ring for a semiconductor manufacturing apparatus according to an embodiment of the present disclosure.
Figure 6:
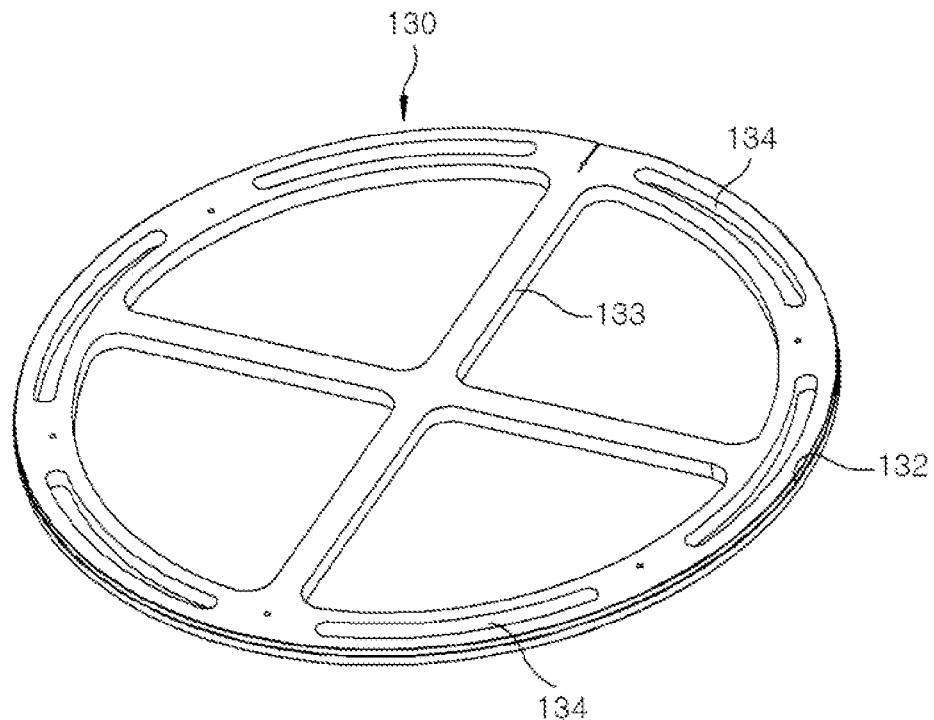
FIG. 6 is a perspective view showing a centering jig in a cooling sheet attachment apparatus to a focusing ring for a semiconductor manufacturing apparatus according to an embodiment of the present disclosure.

To begin with, as shown in FIGS. 1 and 4, the cover 150 is opened from the chamber body 110, and then the cooling sheet 2 is seated for each sheet seating area on the sheet support ring 120. In this instance, the adhesion surface of the cooling sheet 2 faces upward. Subsequently, the focusing ring 1 is placed above the cooling sheet 2 in a manner of being inserted into the outer circumferential surface of the centering jig 130 and supported in a state of being held in the support 132.

Figure 8:
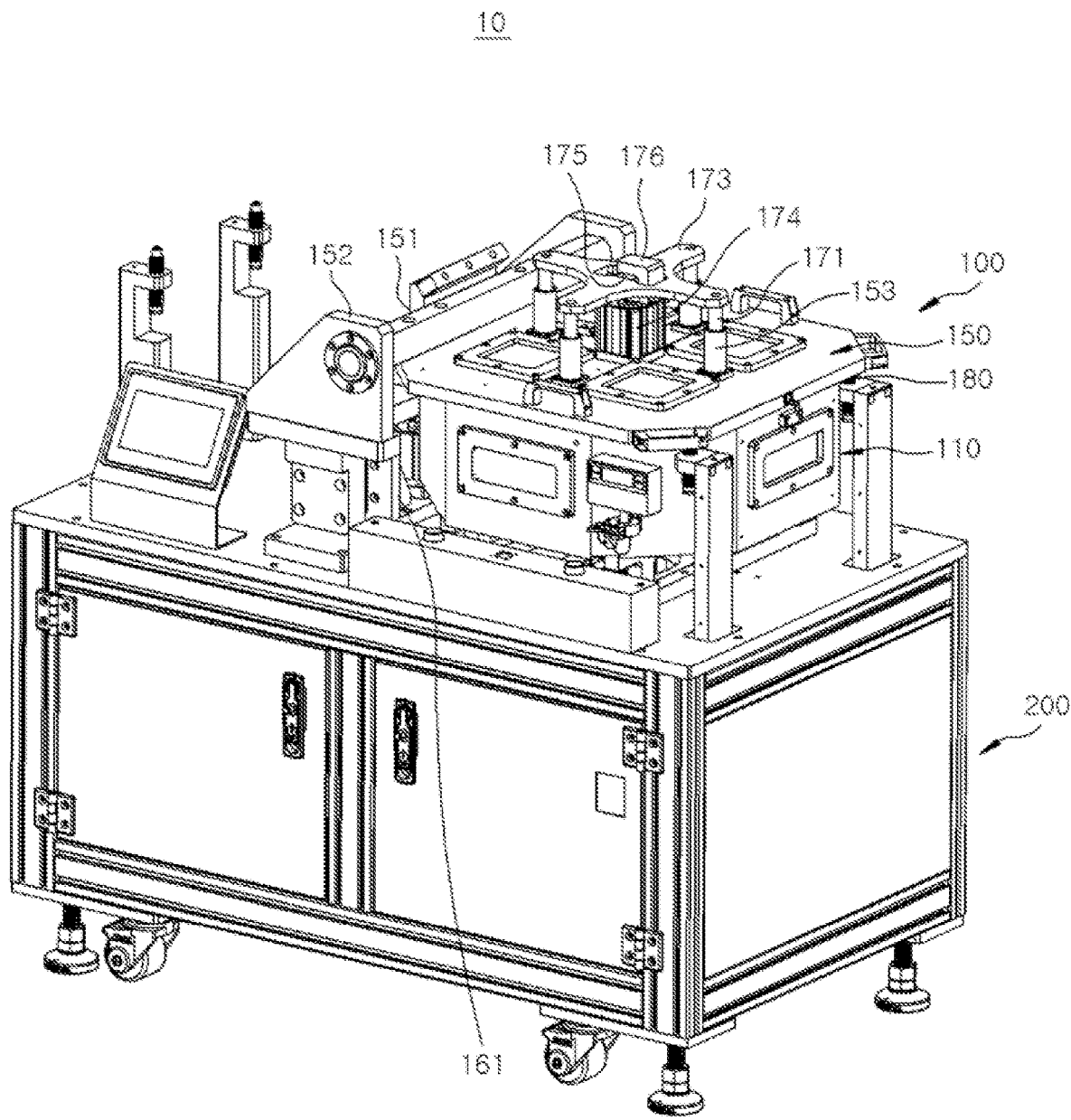
FIG. 8 is a perspective view showing a cooling sheet attachment apparatus to a focusing ring for a semiconductor manufacturing apparatus according to an embodiment of the present disclosure, showing a chamber body closed by a cover.

Additionally, as shown in FIG. 8, by rotation of the cover 150 by the operator, the cover 150 is placed above the chamber body 110 and lifted down by the lift unit 160, and the cover 150 supported by the closed stopper 180 is lifted down while keeping balanced with the balance driving unit 183 to close the chamber body 110, and a vacuum of preset vacuum pressure is created in the chamber body 110 by vacuum suction by the operation of the vacuum suction unit 300. In this instance, the vacuum pressure may be measured through a vacuum pressure sensor installed in the chamber body 110, and the vacuum suction unit 300 may be controlled by the control unit (not shown) having electrically received the measurement value of the vacuum pressure sensor, to cause the vacuum pressure in the chamber body 110 to have a preset vacuum pressure.

Figure 9:
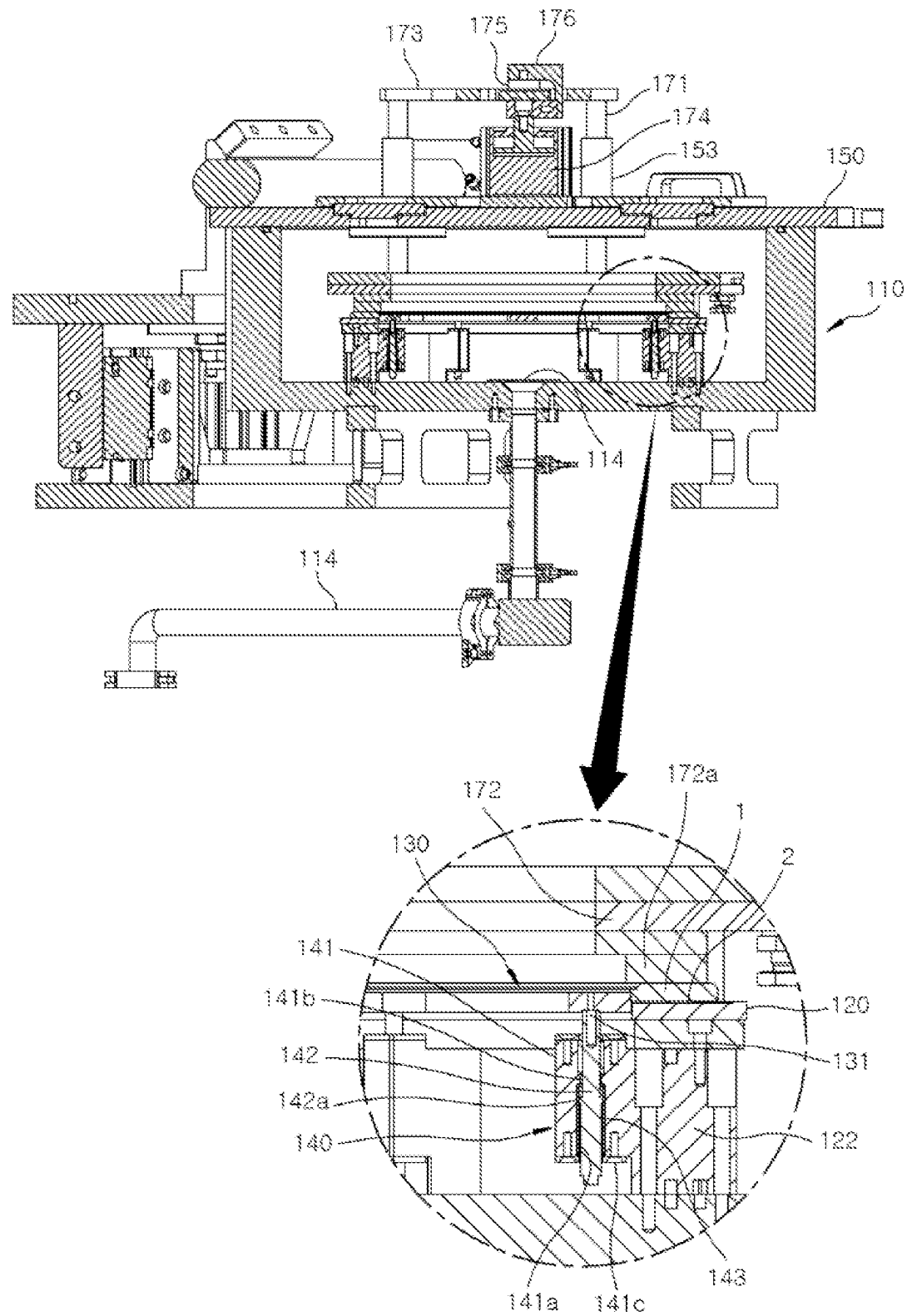
FIG. 9 is a front cross-sectional view showing a cooling sheet attachment apparatus to a focusing ring for a semiconductor manufacturing apparatus according to an embodiment of the present disclosure, showing a focusing ring pressed into tight contact with a cooling sheet.

When the vacuum is created in the chamber body 110, by the operation of the press unit 170, as shown in FIG. 9, the pressing plate 172, to be more specific, the buffer pad 172a of the pressing plate 172 is moved down to press the focusing ring 1, the elastic member 143 of the elastic support 140 is compressed, and the focusing ring 1 is tightly attached to the cooling sheet 2.

Additionally, when the cooling sheet 2 is attached to the focusing ring 1, the operation of the vacuum suction unit 300 is stopped, the press down to the focusing ring 1 by the press unit 170 is released and the focusing ring 1 is moved back in the upward direction by the elastic force of the elastic support 140. Subsequently, the chamber body 110 is devacuumed by the devacuuming unit 600, the cover 150 is lifted up by the lifting operation of the lift unit 160 and the balance driving unit 183, and when the operator opens the cover 150, the focusing ring 1 is unloaded from the chamber body 110.

According to the cooling sheet attachment apparatus to a focusing ring for a semiconductor manufacturing apparatus according to the present disclosure, it is possible to attach the cooling sheet to the focusing ring in an exact position, and facilitate the cooling sheet attachment task, thereby minimizing the time and cost required for the cooling sheet attachment task, and eliminating the need for the operator's skill.

Additionally, according to the present disclosure, as described above, it is possible to improve the attachment quality of the cooling sheet to the focusing ring, thereby increasing the cooling efficiency of the focusing ring, which contributes to semiconductor yield improvements, and prevent bubble formation between the focusing ring and the cooling sheet, thereby minimizing defects in the focusing ring caused by the cooling sheet.

Additionally, according to the present disclosure, it is easily adapted to focusing rings having different sizes only by changing the centering jig.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A cooling sheet attachment apparatus to a focusing ring for a semiconductor manufacturing apparatus, comprising:
    a vacuum chamber comprises:
        a sheet support ring fixed to seat a cooling sheet in a chamber body with an adhesion surface exposed in an upward direction;
        a centering jig installed on an inner or outer circumferential surface of the sheet support ring liftably to be moved back in the upward direction by an elastic support so that the focusing ring is aligned above the cooling sheet in a state of being supported by the centering jig;
        a cover for opening/closing installed above the chamber body and lifted by a lift unit, a press unit provided on the cover to press down the focusing ring so that the cooling sheet is attached to a lower surface of the focusing ring by pressing into tight contact; and
        a vacuum suction tube connected to the chamber body for vacuum suction; and
    a vacuum suction unit creating a vacuum in the vacuum chamber by the suction through the vacuum suction tube,
    wherein the sheet support ring has alignment pins protruding on an upper surface, each of the alignment pins corresponding to each of a plurality of alignment grooves formed at an interval in a circumferential direction on the lower surface of the focusing ring and inserted into each alignment groove, and is supported and fixed by a plurality of fixtures provided vertically on a lower surface of the chamber body, and the elastic support is integrally formed with the fixtures.

2. The cooling sheet attachment apparatus to a focusing ring for a semiconductor manufacturing apparatus of claim 1, wherein the centering jig is installed concentrically in contact with the inner circumferential surface of the sheet support ring and lifted up and down in a state of being elastically supported by the elastic support, and includes a support along an outer circumferential surface in the shape of a step so that the focusing ring is concentrically mounted downward and held and supported in the support, a plurality of alignment grooves formed at an interval along a circumferential direction on a lower surface, each alignment groove in which lifting pins of the elastic support are each mounted, to mount in alignment on the elastic support, and a center reinforcement split into a plurality of branches from a center and connected.

3. The cooling sheet attachment apparatus to a focusing ring for a semiconductor manufacturing apparatus of claim 1, wherein the elastic support comprises:
 a support block integrally formed with each of the fixtures which fix the sheet support ring and provided at a distance in the upward direction apart from a bottom of the chamber body, the support block including a sliding coupler vertically formed and having an open top, and an upper stopper and a lower stopper spaced in a vertical direction apart from each other in the sliding coupler;
 a lifting pin slidably coupled to the sliding coupler, with a top mounted in the alignment grooves formed on the lower surface of the centering jig, and having a stop protrusion provided on an outer side and held in the upper stopper; and
 an elastic member which is inserted into the lifting pin and installed between the stop protrusion and the lower stopper to provide an elastic force to the lifting pin in the upward direction.

4. The cooling sheet attachment apparatus to a focusing ring for a semiconductor manufacturing apparatus of claim 1, wherein the elastic support comprises:
 a support block integrally formed with each of the fixtures which fix the sheet support ring and provided at a distance in the upward direction apart from a bottom of the chamber body, the support block including a sliding coupler vertically formed and having an open top, and an upper stopper and a lower stopper spaced in a vertical direction apart from each other in the sliding coupler;
 a lifting pin slidably coupled to the sliding coupler, with a top mounted in the alignment grooves formed on the lower surface of the centering jig, and having a stop protrusion provided on an outer side and held in the upper stopper; and
 an elastic member which is inserted into the lifting pin and installed between the stop protrusion and the lower stopper to provide an elastic force to the lifting pin in the upward direction.

5. The cooling sheet attachment apparatus to a focusing ring for a semiconductor manufacturing apparatus of claim 2, wherein the elastic support comprises:
 a support block integrally formed with each of the fixtures which fix the sheet support ring and provided at a distance in the upward direction apart from a bottom of the chamber body, the support block including a sliding coupler vertically formed and having an open top, and an upper stopper and a lower stopper spaced in a vertical direction apart from each other in the sliding coupler;
 a lifting pin slidably coupled to the sliding coupler, with a top mounted in the alignment grooves formed on the lower surface of the centering jig, and having a stop protrusion provided on an outer side and held in the upper stopper; and
 an elastic member which is inserted into the lifting pin and installed between the stop protrusion and the lower stopper to provide an elastic force to the lifting pin in the upward direction.

6. The cooling sheet attachment apparatus to a focusing ring for a semiconductor manufacturing apparatus of claim 1,
 wherein the cover is installed to be rotated by a rotating shaft, and when the cover closes the chamber body, the chamber body is not opened by the vacuum created between the cover and the chamber body,
 wherein the lift unit comprises:
 a lift guide to guide the lifting; and
 a lift driving unit.

7. The cooling sheet attachment apparatus to a focusing ring for a semiconductor manufacturing apparatus of claim 2,
 wherein the cover is installed to be rotated by a rotating shaft, and when the cover closes the chamber body, the chamber body is not opened by the vacuum created between the cover and the chamber body,
 wherein the lift unit comprises:
 a lift guide to guide the lifting; and
 a lift driving unit.

8. The cooling sheet attachment apparatus to a focusing ring for a semiconductor manufacturing apparatus of claim 1, wherein the press unit includes:
 a plurality of sliding shafts passing through and installed slidably in the cover;
 a pressing plate fixed to an end of each sliding shaft, and inserted into the chamber body when the cover closes the chamber body;
 a connecting plate fixed to an opposite end of each sliding shaft, and disposed opposite the pressing plate with the cover interposed between;
 a press driving unit installed between the connecting plate and the cover to move the connecting plate to allow the pressing plate to press the focusing ring on the centering jig or release the pressing;
 a pressing piece fixed to the press driving unit to transmit an up-down reciprocating driving force of the press driving unit to the connecting plate; and
 a load cell interposed between the pressing piece and the connecting plate to measure a downward pressing force applied to the connecting plate by the press driving unit and output a sensing signal.

9. The cooling sheet attachment apparatus to a focusing ring for a semiconductor manufacturing apparatus of claim 2, wherein the press unit includes:
 a plurality of sliding shafts passing through and installed slidably in the cover;
 a pressing plate fixed to an end of each sliding shaft, and inserted into the chamber body when the cover closes the chamber body;
 a connecting plate fixed to an opposite end of each sliding shaft, and disposed opposite the pressing plate with the cover interposed between;

a press driving unit installed between the connecting plate and the cover to move the connecting plate to allow the pressing plate to press the focusing ring on the centering jig or release the pressing;

a pressing piece fixed to the press driving unit to transmit an up-down reciprocating driving force of the press driving unit to the connecting plate; and a load cell interposed between the pressing piece and the connecting plate to measure a downward pressing force applied to the connecting plate by the press driving unit and output a sensing signal.

* * * * *